US012620438B2

(12) United States Patent
Gupta et al.

(10) Patent No.: US 12,620,438 B2
(45) Date of Patent: May 5, 2026

(54) RETENTION MODE LOW LEAKAGE HIGH PERFORMANCE BIT LINE CLAMPING SCHEME BASED ON AN OUTPUT LATCH STATE

(71) Applicant: NVIDIA Corporation, Santa Clara, CA (US)

(72) Inventors: Lalit Gupta, Fremont, CA (US); Cagri Erbagci, Pittsburgh, PA (US)

(73) Assignee: NVIDIA Corporation, Santa Clara, CA (US)

( * ) Notice: Subject to any disclaimer, the term of this patent is extended or adjusted under 35 U.S.C. 154(b) by 99 days.

(21) Appl. No.: 18/680,945

(22) Filed: May 31, 2024

(65) Prior Publication Data

US 2025/0372161 A1     Dec. 4, 2025

(51) Int. Cl.
G11C 11/419          (2006.01)
G11C 11/418          (2006.01)

(52) U.S. Cl.
CPC .......... G11C 11/419 (2013.01); G11C 11/418 (2013.01)

(58) Field of Classification Search
CPC ............................. G11C 11/419; G11C 11/41

USPC ...................................................... 365/189.11
See application file for complete search history.

(56) References Cited

U.S. PATENT DOCUMENTS

| | | | | |
|---|---|---|---|---|
| 2012/0250440 A1* | 10/2012 | Wu | .......................... | G11C 7/065 |
| | | | | 365/207 |
| 2016/0118108 A1* | 4/2016 | Yamamoto | ............... | G11C 8/16 |
| | | | | 365/154 |
| 2019/0228821 A1* | 7/2019 | Koay | ................. | H03K 19/1776 |
| 2021/0027833 A1* | 1/2021 | Chowdhury | .......... | G11C 11/419 |

* cited by examiner

*Primary Examiner* — Muna A Techane

(57)          ABSTRACT

An on-chip static RAM (SRAM) is disclosed. In one embodiment, the on-chip SRAM includes an array of memory cells arranged in columns and rows, a read bit line for each column of the array of memory cells, and an output latch to store a bit for one of the array of memory cells when the on-chip SRAM is in a retention mode. In one embodiment, each memory cell in the column is connected to the read bit line for that column and the output latch includes a transistor that does not allow the read bit line for the column corresponding to the one of the array of memory cells to pre-charge when a data latch in the output latch is in a high state.

24 Claims, 7 Drawing Sheets

RETENTION MODE LOW LEAKAGE HIGH PERFORMANCE BIT LINE CLAMPING SCHEME BASED ON AN OUTPUT LATCH STATE

TECHNICAL FIELD

This application is directed, in general, to on-chip static RAMs (SRAMs) and, more specifically, to a low leakage, high performance bit line clamping scheme based on a state of an output latch in retention mode.

BACKGROUND

In large-scale integrated circuits (ICs), the consumption of power is of significant interest. Faster and faster speeds of these ICs mean higher and higher power consumption by the ICs. Moreover, operation of many circuits in these ICs, e.g., on-chip SRAMs, also add to higher power consumption because of leakage of current in, e.g., transistors at idle. In some applications of the ICs, for example battery powered applications such as mobile communication devices, management of the power consumed by the IC is important so that performance levels of the IC can continue to increase.

SUMMARY OF THE DISCLOSURE

In one aspect, an on-chip static RAM (SRAM) is disclosed. In one embodiment, the on-chip SRAM comprises an array of memory cells arranged in columns and rows, a read bit line (RBL) and read bit line complement ($\overline{RBL}$) for each column of the array of memory cells, a word line (WL) for each row of the array of memory cells, and an output latch to store a bit for one of the array of memory cells in a data latch of the output latch when the on-chip SRAM is in a retention mode. In one embodiment, each memory cell in the column is connected to the RBL and $\overline{RBL}$ for that column and each memory cell in the row is connected to the WL of that row. In one embodiment, the output latch includes a first transistor where when the data latch is in a high state, the first transistor prevents pre-charging of the ($\overline{RBL}$) for the column corresponding to the one of the array of memory cells.

In another aspect, a method of pre-charging a read bit line of an on-chip static RAM (SRAM) comprising an array of memory cells arranged in columns and rows is disclosed. In one embodiment, the method comprises storing a bit for one of the array of memory cells in a data latch of an output latch when the on-chip SRAM enters a retention mode and, when the data latch is in a high state, allowing the read bit line to float rather than pre-charge.

In another aspect, an integrated circuit (IC) is disclosed. In one embodiment, the IC comprises a memory controller to generate a retention enable signal (RET_EN) and an on-chip static RAM (SRAM). In one embodiment, the on-chip SRAM includes an array of memory cells arranged in columns and rows and an output latch to store a bit for one of the array of memory cells in a data latch of the output latch when the on-chip SRAM is in a retention mode. In one embodiment, the retention mode is based on the RET_EN signal and a first transistor of the output latch prevents pre-charging a read bit line complement ($\overline{RBL}$) for a column of the array of memory cells corresponding to the one of the array of memory cells when the data latch is in a high state.

In still another aspect, a library of circuit designs is disclosed. In one embodiment, the library comprises a design for an on-chip static RAM (SRAM). In one embodiment, the on-chip SRAM includes an array of memory cells arranged in columns and rows, a read bit line (RBL) and read bit line complement ($\overline{RBL}$) for each column of the array of memory cells, a word line (WL) for each row of the array of memory cells, and an output latch to store a bit for one of the array of memory cells in a data latch of the output latch when the on-chip SRAM is in a retention mode. In one embodiment, each memory cell in the column is connected to the RBL and $\overline{RBL}$ for that column. In one embodiment, when the data latch is in a high state, a first transistor of the output latch prevents pre-charging of $\overline{RBL}$ for the column corresponding to the one of the array of memory cells.

In yet another aspect, a battery powered mobile communications device comprising an integrated circuit (IC) is disclosed. In one embodiment, the IC comprises at least one processor, a memory controller, and an on-chip memory. In one embodiment, the on-chip memory includes an array of memory cells arranged in columns and rows, a read bit line (RBL) and read bit line complement ($\overline{RBL}$) for each column of the array of memory cells, a word line (WL) for each row of the array of memory cells, and an output latch to store a bit for one of the array of memory cells in a data latch of the output latch when the on-chip memory is in a retention mode. In one embodiment, each memory cell in the column is connected to the RBL and $\overline{RBL}$ for that column and each memory cell in the row is connected to the WL of that row. In one embodiment, a first transistor of the output latch is controlled by the memory controller, where when the data latch is in a high state, the first transistor prevents pre-charging of the $\overline{RBL}$ for the column corresponding to the one of the array of memory cells.

In still yet another aspect, an on-chip static memory is disclosed. In one embodiment, the on-chip memory includes an array of memory cells arranged in columns and rows, a read bit line for each column of the array of memory cells, and an output latch to store a bit for one of the array of memory cells when the on-chip memory is in a retention mode. In one embodiment, each memory cell in the column is connected to the read bit line for that column and the output latch includes a transistor that does not allow the read bit line for the column corresponding to the one of the array of memory cells to pre-charge when a data latch in the output latch is in a high state.

BRIEF DESCRIPTION OF THE DRAWINGS

Reference is now made to the following descriptions taken in conjunction with the accompanying drawings, in which.

DETAILED DESCRIPTION OF THE DISCLOSURE

Figure 1:
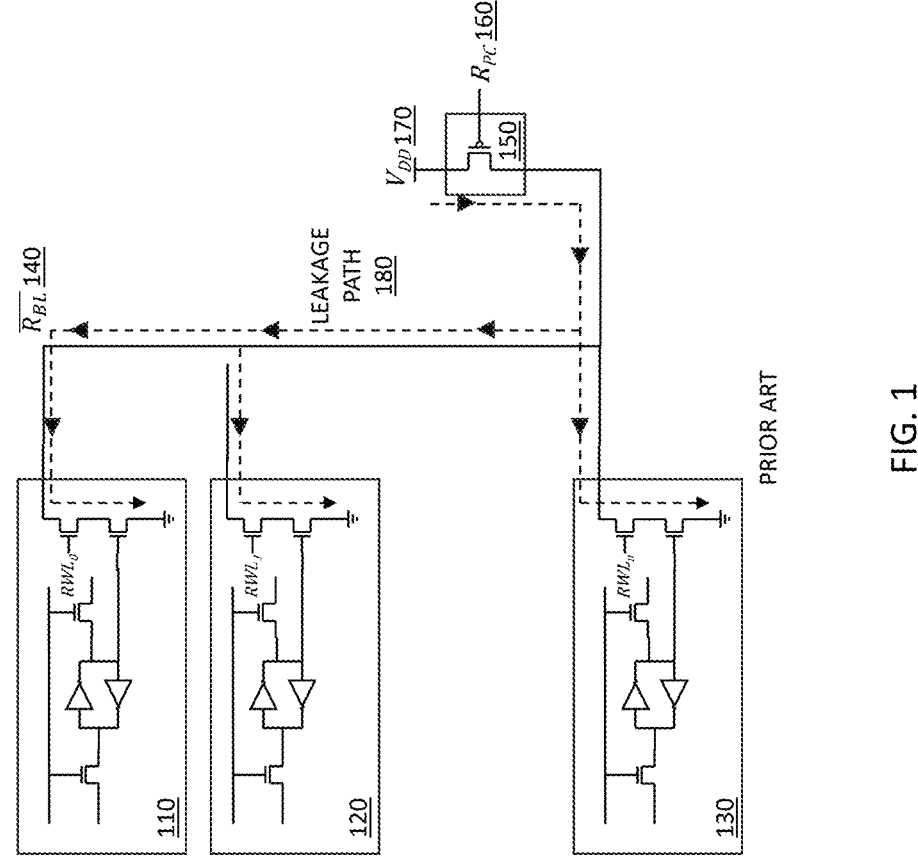
FIG. 1 illustrates a circuit diagram for memory cells for a conventional on-chip SRAM highlighting a current leakage path during pre-charge of a read bit line.
Figure 1:
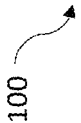

As noted above, in order for performance of large-scale ICs to continue to increase, reducing power consumption of circuits in the ICs is important, particularly power consumed by idle portions of these circuits. In some examples of IC power management, a technique termed "power gating" is employed. Power gating is a technique used in ICs to reduce power consumption by shutting off current to blocks of the IC that are not in use to, for example, prevent the above-mentioned leakage of current in, e.g., transistors at idle. In the case of on-chip SRAMs of an IC, the SRAM is put into a retention mode when power gating is employed. As the on-chip SRAM transitions into retention mode, the contents of individual memory cells are stored in an output latch. At this point, power can then be shut off to various portions of the on-chip SRAM. However, in many implementations power is not shut off to the memory cells themselves or the output latches. The power saved by shutting off other portions of the on-chip SRAM during power gating can be significant.

When emerging from the retention mode, it is important to ensure that data stored in the output latch prior to entering the retention mode is the same data output from the output latch after emerging from the retention mode. To accomplish this, in addition to power being maintained to the memory cells and output latches during retention mode as discussed above, bit lines, including read bit lines, e.g., $\overline{R_{BL}}$, are conventionally pre-charged during the retention mode.

However, having the bit lines pre-charged during retention mode allows for charge in the form of current to leak from the memory cells when in retention mode as noted above. The amount of current leaking from pre-charged bit lines during retention mode for these cells can be quite high. However, if the data in the output latch is high, it is not necessary to pre-charge the read bit line as, since power is maintained to the output latch, the high state of the latch will be maintained when coming out of the retention mode. Thus, a read bit line, e.g., $\overline{R_{BL}}$, does not have to be pre-charged during the retention mode if the data in the output latch is high. Not pre-charging the read bit line during the retention mode when the data in the output latch is high (essentially allowing the read bit line voltage to float) saves power. This disclosure provides circuitry and a method of using this circuitry to eliminate the above-discussed leakage during retention mode when the data in the output latch is high while still ensuring that data stored in the output latch prior to entering the retention mode is the same data output from the output latch after emerging from the retention mode. The disclosed circuitry and method allows for read bit lines, e.g., $\overline{R_{BL}}$, to not be pre-charged during the retention mode when the data in the output latch is high, thereby conserving power that would have conventionally leaked from memory cells during the retention mode.

Referring to the drawings, specifically FIG. 1, a circuit diagram for memory cells for a conventional on-chip SRAM 100 is shown. As discussed above, during power gating, when on-chip SRAM is put into retention mode, read bit lines, e.g., $\overline{R_{BL}}$, are pre-charged during the retention mode so that data is maintained when the on-chip SRAM comes out of retention mode. FIG. 1 depicts a plurality of memory cells 110, 120, 130 of a same column in an array of memory cells of the on-chip SRAM. All of memory cells 110, 120, 130 are connected to read bit line $\overline{R_{BL}}$ 140. While FIG. 1 depicts only three memory cells in a singular column, typically many more memory cells are present in the column where each memory cell is addressed by distinct word lines.

As disclosed above, read bit line $\overline{R_{BL}}$ 140 is conventionally pre-charged when the on-chip SRAM goes into retention mode. This is accomplished by read pre-charge transistor 150. In the embodiment shown in FIG. 1, read pre-charge transistor 150 is a PMOSFET transistor. As such, when a signal applied to the gate of PMOS read pre-charge transistor 150 is asserted low, PMOS read pre-charge transistor 150 is turned on and will conduct current. Conventionally, a read pre-charge signal, e.g., $R_{PC}$ 160 is asserted low when read bit line $\overline{R_{BL}}$ 140 is to be pre-charged when the on-chip SRAM enters the retention mode. The current conducted by PMOS read pre-charge transistor 150 is supplied from voltage supply $V_{DD}$ 170. Thus, in conventional on-chip SRAMs, a read pre-charge signal for a distinct column of memory cells of the array of memory cells, e.g., $R_{PC}$ 160, is asserted low when the on-chip SRAM is put in retention mode.

When a specific read bit line, e.g., $\overline{R_{BL}}$ 140, is pre-charged during retention mode, e.g., when PMOS read pre-charge transistor 150 conducts, e.g., via read pre-charge signal $R_{PC}$ 160, current provided by, e.g., voltage supply $V_{DD}$ 170, is applied to each memory cell 110, 120, 130 in a distinct column of memory cells connected to, e.g., read bit line $\overline{R_{BL}}$ 140. This current can leak through circuitry in each memory cell 110, 120, 130, e.g., idle transistors in each memory cell (depicted in FIG. 1 as stacked NMOSFET transistors of each of memory cells 110, 120, 130—not labeled). It is this leakage of current through idle transistors in each memory cell in a distinct column that causes higher power consumption. The path of this leakage current is identified as leakage path 180 in FIG. 1. When there are a higher number of memory cells in any one column of the array of memory cells in the on-chip SRAM, this leakage current causes an unwanted noticeable increase in power consumption. As noted above, the goal of power gating is to reduce power consumption, not increase it, when the on-chip SRAM is put into retention mode during power gating.

Figure 2:
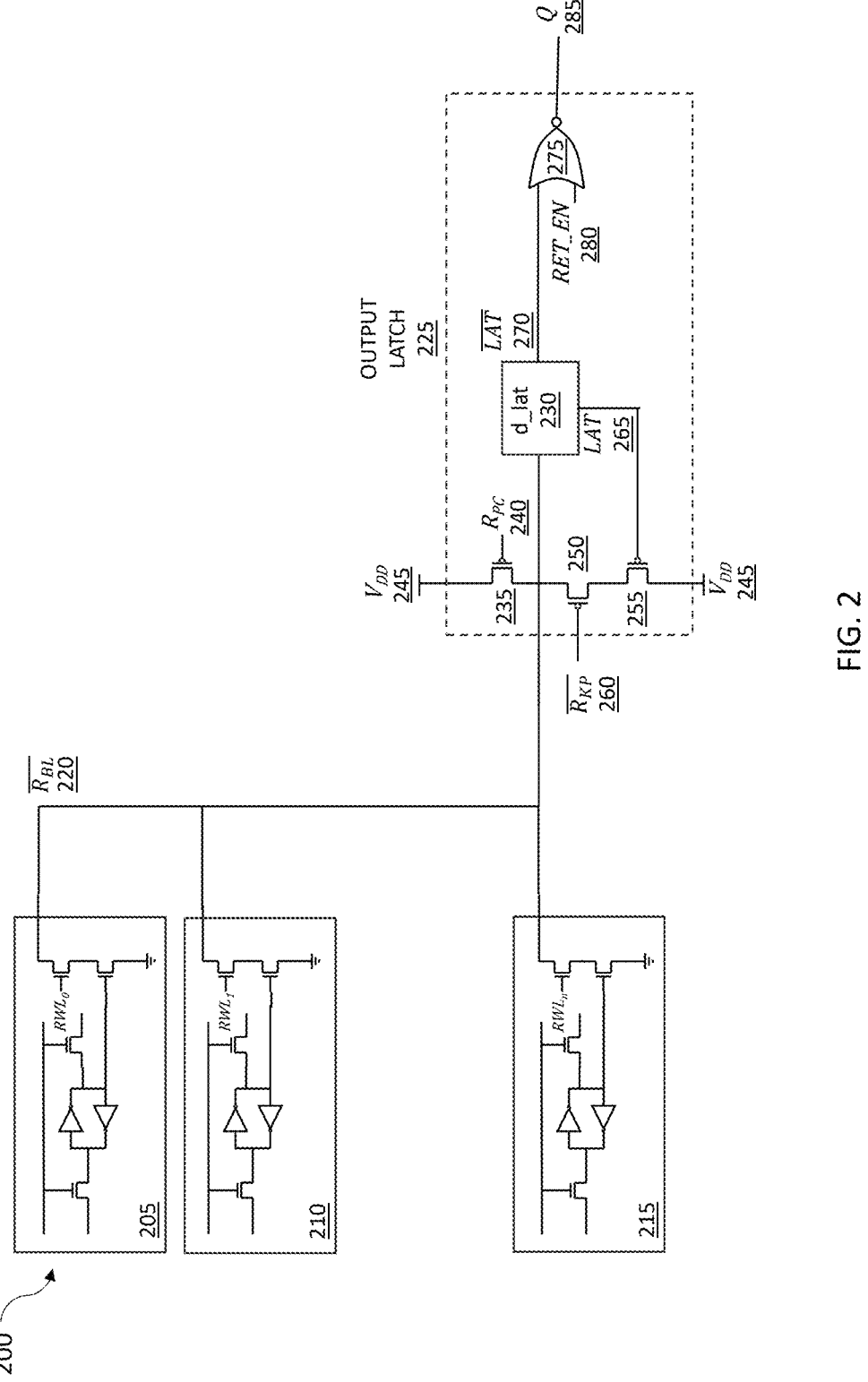
FIG. 2 illustrates a circuit diagram of an example of an on-chip SRAM having an output latch constructed according to the principles of the disclosure.

FIG. 2 illustrates a circuit diagram of an example of an on-chip SRAM 200 having an output latch constructed according to the principles of the disclosure. A plurality of memory cells 205, 210, 215, for a distinct column of memory cells (of an array memory cells in the on-chip SRAM), similar to memory cells 110, 120, 130 of FIG. 1, are depicted in FIG. 2. While only three memory cells for a distinct column of memory cells are depicted, many embodiments will include many more memory cells in each distinct column of memory cells. Read bit line $\overline{R_{BL}}$ 220, similar to read bit line $\overline{R_{BL}}$ 140 of FIG. 1, is shown connected to each of the plurality of memory cells in the distinct column of memory cells of FIG. 2 similar to the connection of read bit line $\overline{R_{BL}}$ 140 with memory cells 110, 120, 130 of FIG. 1. As discussed above, as the on-chip SRAM transitions into retention mode, the contents of individual memory cells are stored in an output latch and it is important to ensure that data stored in the output latch prior to entering the retention mode is the same data output from the output latch after emerging from the retention mode.

Conventionally, this output latch is, in many embodiments, a d-type latch, similar to d_lat 230 of FIG. 2.

Moreover, conventional output latches of on-chip SRAMs can also include a read pre-charge transistor, similar to PMOS read pre-charge transistor 150 of FIG. 1 or PMOS read pre-charge transistor 235 of FIG. 2, which operates as discussed above, i.e., a read pre-charge signal, e.g., read pre-charge signal $R_{PC}$ 160 of FIG. 1 or read pre-charge signal $R_{PC}$ 240 of FIG. 2, is applied low to the PMOS read pre-charge transistor which causes the PMOS read pre-charge transistor to conduct current from a voltage supply, e.g., voltage supply $V_{DD}$ 170 of FIG. 1 or voltage supply $V_{DD}$ 245 of FIG. 2, to pre-charge the read bit line, e.g., read bit line $\overline{R_{BL}}$ 140 of FIG. 1 or read bit line $\overline{R_{BL}}$ 220 of FIG. 2, when the on-chip SRAM is in retention mode.

FIG. 2 depicts output latch 225 constructed according to the principles of the disclosure. Output latch 225 includes the conventional d-type latch, e.g., d_lat 230, and the conventional read pre-charge transistor, e.g., read pre-charge transistor 235 configured to receive a read pre-charge signal, e.g., read pre-charge signal $R_{PC}$ 240. However, as disclosed below, operation of read pre-charge transistor 235 of output latch 225 does not operate as a conventional read pre-charge transistor, e.g., read pre-charge transistor 150 of FIG. 1, as described above.

Output latch 225 further includes transistors 250, 255. In the embodiment of FIG. 2, transistors 235, 250, 255 are PMOS transistors and, as such, conduct when a low signal is applied to their respective gates. PMOS transistors 235, 250, and 255 of output latch 225 are connected in series, i.e., the drain/source of transistor 235 is connected to the source/drain of transistor 250 and the drain/source of transistor 250 is connected to the source/drain of transistor 255. Additionally, voltage supply $V_{DD}$ 245 is connected to both the source/drain of transistor 235 and the drain/source of transistor 255.

In operation, when the on-chip SRAM is placed in retention mode, rather than asserting the read pre-charge signal low, e.g., read pre-charge signal $R_{PC}$ 240, as conventionally performed to pre-charge the read bit line, e.g., read bit line $\overline{R_{BL}}$ 220 (as discussed above), the read pre-charge signal, e.g., read pre-charge signal $R_{PC}$ 240, is asserted high. As such, the read pre-charge transistor, e.g., PMOS read pre-charge transistor 235, will not conduct and current from voltage supply $V_{DD}$ 245 will not pre-charge the read bit line, e.g., read bit line $\overline{R_{BL}}$ 220, when the on-chip SRAM is placed in retention mode.

d_lat 230 of output latch 225 outputs a latch signal, e.g., latch signal LAT 265, representative of data in d_lat 230 to the gate of PMOS latch transistor 255. If data in d_lat 230 is high, latch signal LAT 265 will be high and if data in d_lat 230 is low, latch signal LAT 265 will be low. Thus, if the data in d_lat 230 is high, latch signal LAT 265 is high (and is applied to the gate of PMOS latch transistor 255) and PMOS latch transistor 255 will not conduct. Thus, since neither the read pre-charge transistor, e.g., read pre-charge transistor 235, nor the latch transistor, e.g., PMOS latch transistor 255, conduct when the data in the output latch, e.g., the data in d_lat 230, is high, the read bit line, e.g., $\overline{R_{BL}}$ 220 will not pre-charge. This will allow the voltage on the read bit line, e.g., read bit line $\overline{R_{BL}}$ 220, to float when the data in the output latch, e.g., d_lat 230 of output latch 230, is high and power consumption of the on-chip SRAM is reduced since current cannot leak from the voltage supply, e.g., voltage supply $V_{DD}$ 245, back through idle transistors in memory cells 205, 210, 215.

However, if the data in the output latch, e.g., d_lat 230 of output latch 225, is low, latch signal LAT 265 is low (and is applied to the gate of latch transistor 255) and PMOS latch transistor 255 will conduct current from the voltage supply, e.g., voltage supply $V_{DD}$ 245, to pre-charge the read bit line, e.g., $\overline{R_{BL}}$ 220, via the latch transistor, e.g., latch transistor 225. Thus, even though the read pre-charge transistor, e.g., read pre-charge transistor 235, does not conduct, since the data in the output latch, e.g., d_lat 230 of output latch 225, is low, the read bit line, e.g., $\overline{R_{BL}}$ 220, will be pre-charged, albeit via the latch transistor, e.g., PMOS latch transistor 255, rather than via the read pre-charge transistor, e.g., read pre-charge transistor 240, as is conventionally performed (and discussed above).

As depicted in FIG. 2, output latch 225 comprises another transistor located between latch transistor 255 and read pre-charge transistor 235, e.g., read keeper transistor 250. In the embodiment of FIG. 2, read keeper transistor 250 is a PMOSFET so that it will conduct when a low signal is applied to its gate. When power gating causes the on-chip SRAM to go into retention mode and the data in the output latch, e.g., d_lat 230 of output latch 225 is low, the read bit line, e.g., read bit line $\overline{R_{BL}}$ 220, should be pre-charged as discussed above. In order to pre-charge the read bit line, e.g., read bit line $\overline{R_{BL}}$ 220, the read keeper signal, e.g., read keeper signal $R_{KP}$ 260, must cause the read keeper transistor, e.g., read keeper transistor 250, to conduct so that current flowing through the latch transistor, e.g., latch transistor 255 (turned on by the low data state of d_lat 230), can pre-charge the read bit line, e.g., read bit line $\overline{R_{BL}}$ 220. Thus, when power gating causes the on-chip SRAM to go into retention mode and the data in the output latch is low, the read bit line, e.g., read bit line $\overline{R_{BL}}$ 220, the read keeper transistor, e.g., read keeper transistor 250, allows the read bit line, e.g., read bit line $\overline{R_{BL}}$ 220, to pre-charge (via current from the power supply passing through the latch transistor).

In many embodiments, when power gating is used to cause the on-chip SRAM to go into retention mode, a retention mode enable signal, e.g., RET_EN 280, is provided to the on-chip SRAM. When the retention mode enable signal, e.g., RET_EN 280, is asserted, whatever portions of the on-chip SRAM that are powered down, i.e., during power gating, will be powered down. Further, when the retention mode enable signal, e.g., RET_EN 280, is de-asserted, those portions of the on-chip SRAM that were powered down are powered back up and, importantly as discussed above, the output of the output latch, e.g., output signal Q (285) from output latch 225, must maintain its previous state, whether the read bit line, e.g., read bit line $\overline{R_{BL}}$ 220, is pre-charged or not.

Output latch 225 further includes NOR gate 275 whose inputs are the inverse of the data in d_lat 230, e.g., $\overline{LAT}$ 270, and the retention mode enable signal, e.g., RET_EN 280. Thus, when the data in the output latch, e.g., data in d_lat 230 of output latch 225, is high prior to entry into retention mode, its inverse, e.g., $\overline{LAT}$ 270, is low. When the on-chip SRAM enters the retention mode, the data in d_lat 230 of output latch 225 is held high (assuming power is provided to the output latches of on-chip SRAM 200 when the on-chip SRAM 200 is in retention mode) and its inverse, e.g., $\overline{LAT}$ 270, is held low. When the on-chip SRAM comes out of retention mode, the retention mode enable signal, e.g., RET_EN 280 is de-asserted. At this point, the output signal from the output latch, e.g., output signal Q 285 of output latch 225, will return to the high state as it was prior to entry into the retention mode since the inputs to NOR gate 275 will both be low (inverse of d_lat 230 of output latch 225, e.g., $\overline{LAT}$ 270, is low and RET_EN 280 is low).

In some embodiments, some or all of the read pre-charge, read keeper, and/or latch transistors, e.g., transistors 235, 250, 255, are external to the output latch, e.g., output latch 225. In some embodiments, the NOR gate, e.g., NOR gate 275 is external to the output latch, e.g., output latch 225.

Figure 3:
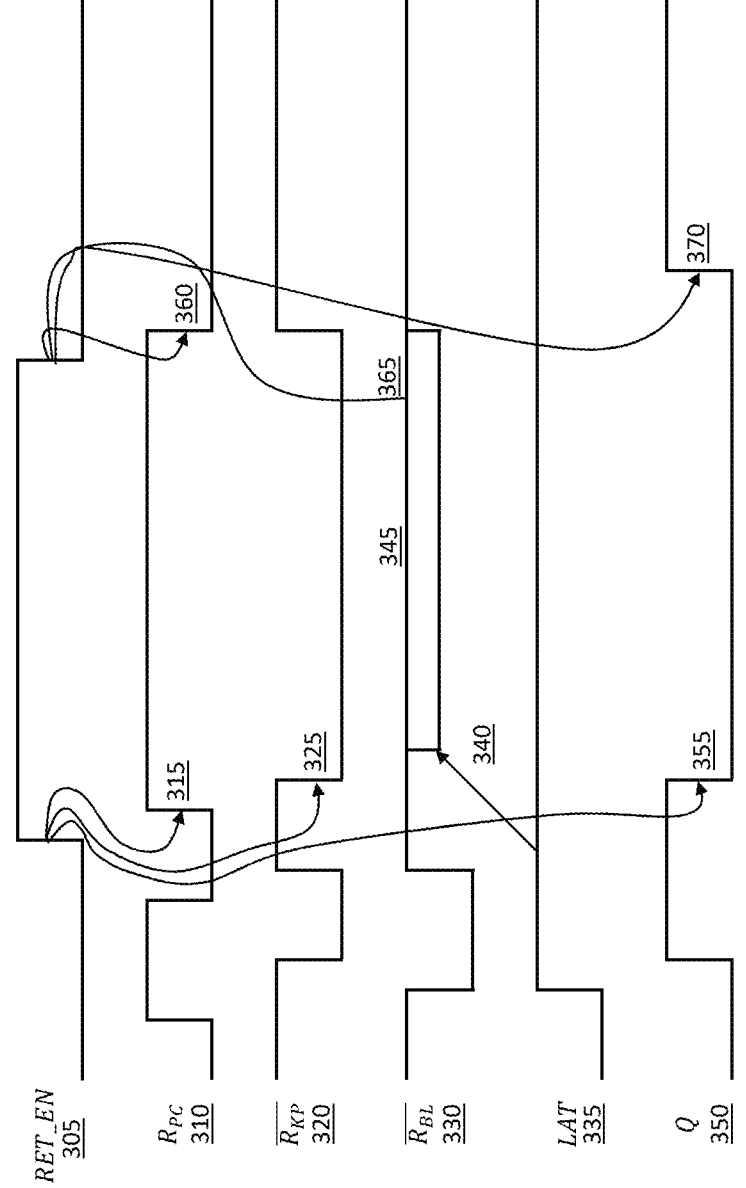
FIG. 3 illustrates timing diagram of signals in an on-chip SRAM for a read bit line when the data in the output latch is high, allowing the voltage on the read bit line to float, according to principles of the disclosure.
Figure 3:
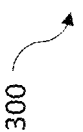

FIG. 3 illustrates timing diagram 300 of signals in an on-chip SRAM, such as on-chip SRAM 200, for pre-charging a read bit line when the data in the output latch is high according to principles of the disclosure. As discussed above, when power gating is used to cause the on-chip SRAM to go into retention mode, a retention mode enable signal, e.g., RET_EN 280 of FIG. 2, is provided to the on-chip SRAM. Timing diagram 300 includes waveforms that demonstrate a timing sequence for read bit line pre-charging when data in the output latch is high. Timing diagram 300 includes retention mode enable signal RET_EN 305 received by the on-chip SRAM when power gating causes the on-chip SRAM to enter the retention mode. Soon after (if not immediately upon assertion thereof) retention mode enable signal RET_EN 305 is asserted high, read pre-charge signal $R_{PC}$ 310 (similar to read pre-charge signal $R_{PC}$ 240 of FIG. 2), is also asserted high as depicted by arrow 315. As disclosed above, when the read pre-charge signal, e.g., read pre-charge signal $R_{PC}$ 240 of FIG. 2, is asserted high, the read pre-charge transistor, e.g., PMOS read pre-charge transistor 235 of FIG. 2, will not conduct and current from voltage supply $V_{DD}$ 245 will not pre-charge the read bit line, e.g., read bit line $\overline{R_{BL}}$ 220 of FIG. 2.

However, since the data in the output latch, e.g., data in d_lat 230 of output latch 225 of FIG. 2, is high, the latch signal, e.g., latch signal LAT 265 of FIG. 2, is high as depicted by LAT waveform 335. As disclosed above, because the data in the output latch, e.g., data in d_lat 230 of output latch 225 of FIG. 2, is high, the read bit line, e.g., read bit line $\overline{R_{BL}}$ 220 of FIG. 2, will not be pre-charged as depicted by arrow 340. As depicted by $\overline{R_{BL}}$ signal 330, after RET_EN 305 is asserted high, $\overline{R_{BL}}$ signal 330 will float in region 345, saving power consumption as disclosed above.

Also soon after (if not immediately upon assertion thereof) retention mode enable signal RET_EN 305 is asserted high, read keeper signal $\overline{R_{KP}}$ 320 (similar to read keeper signal $\overline{R_{KP}}$ 260 of FIG. 2) is de-asserted low as depicted by arrow 325. Output signal Q 350 from the output latch, e.g., output signal Q 285 of output latch 225 of FIG. 2, is depicted in a high state prior to entry of the on-chip SRAM into retention mode by retention mode enable signal RET_EN 305. Soon after (if not immediately upon assertion thereof) retention mode enable signal RET_EN 305 is asserted high, output signal Q 350 goes low.

Soon after (if not immediately upon de-assertion thereof) retention mode enable signal RET_EN 305 is de-asserted, read pre-charge signal $R_{PC}$ 310 is also de-asserted as indicated by arrow 360. As disclosed above, when the read pre-charge signal, e.g., read pre-charge signal $R_{PC}$ 310 or, similarly, read pre-charge signal $R_{PC}$ 240 of FIG. 2, is de-asserted low, the read bit line, e.g., read bit line $\overline{R_{BL}}$ 220 of FIG. 2, will be pre-charged as depicted by line 365.

Also as disclosed above, soon after, i.e., if not immediately upon assertion thereof then immediately thereafter, retention mode enable signal RET_EN 305 is asserted high (when data in the output latch is high) the output signal from the output latch, e.g., output signal Q 285 of output latch 225 of FIG. 2, returns to its original high state as depicted by arrow 270.

Figure 4:
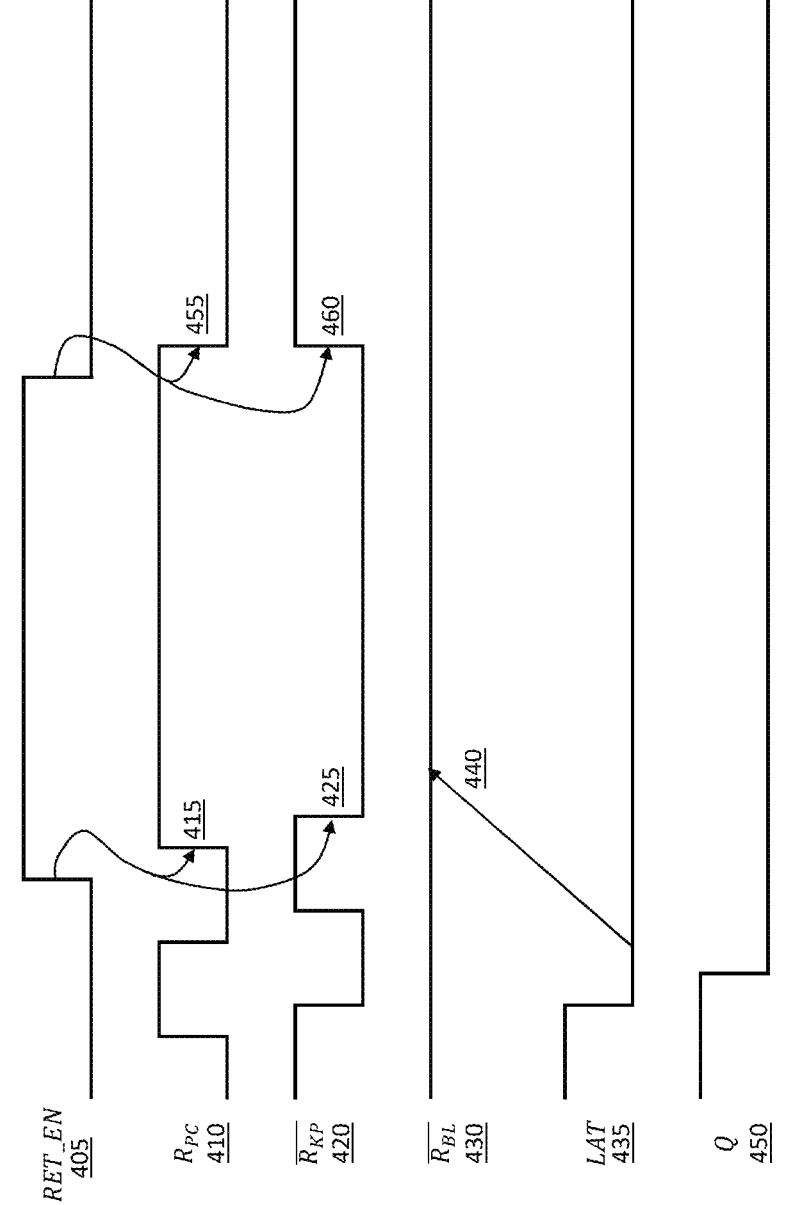
FIG. 4 illustrates timing diagram of signals in an on-chip SRAM for pre-charging a read bit line when the data in the output latch is low according to principles of the disclosure.
Figure 4:
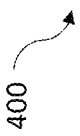

FIG. 4 illustrates timing diagram 400 of signals in an on-chip SRAM for pre-charging a read bit line when the data in the output latch is low according to principles of the disclosure. Timing diagram 400 includes waveforms that demonstrate a timing sequence for read bit line pre-charging when data in the output latch is low. Timing diagram 400 includes retention mode enable signal RET_EN 405 received by the on-chip SRAM when power gating causes the on-chip SRAM to enter the retention mode. Soon after retention mode enable signal RET_EN 405 is asserted high, read pre-charge signal $R_{PC}$ 410 (similar to read pre-charge signal $R_{PC}$ 240 of FIG. 2), is also asserted high as depicted by arrow 415. As disclosed above, when the read pre-charge signal, e.g., read pre-charge signal $R_{PC}$ 240 of FIG. 2, is asserted high, the read pre-charge transistor, e.g., PMOS read pre-charge transistor 235 of FIG. 2, will not conduct and current from voltage supply $V_{DD}$ 245 will not pre-charge the read bit line, e.g., read bit line $\overline{R_{BL}}$ 220 of FIG. 2.

Since the data in the output latch, e.g., data in d_lat 230 of output latch 225 of FIG. 2, is low, the latch signal, e.g., latch signal LAT 265 of FIG. 2, is low as depicted by LAT waveform 435. As disclosed above, because the data in the output latch, e.g., data in d_lat 230 of output latch 225 of FIG. 2, is low, the read bit line, e.g., read bit line $\overline{R_{BL}}$ 220 of FIG. 2, will be pre-charged as depicted by arrow 440. As depicted by $\overline{R_{BL}}$ signal 430, after RET_EN 305 is asserted high, RBL signal 430 remain pre-charged.

Also soon after retention mode enable signal RET_EN 405 is asserted high, read keeper signal $\overline{R_{KP}}$ 415 (similar to read keeper signal $\overline{R_{KP}}$ 260 of FIG. 2) is de-asserted low as depicted by arrow 425.

Soon after retention mode enable signal RET_EN 405 is de-asserted, read pre-charge signal $R_{PC}$ 410 is also de-asserted as indicated by arrow 455. As disclosed above, when the read pre-charge signal, e.g., read pre-charge signal $R_{PC}$ 410 or, similarly, read pre-charge signal $R_{PC}$ 240 of FIG. 2, is de-asserted low, the read bit line, e.g., read bit line $\overline{R_{BL}}$ 220 of FIG. 2, will, in this case, continue to be pre-charged as depicted by $\overline{R_{BL}}$ signal 430. Further, soon after retention mode enable signal RET_EN 405 is de-asserted, read keeper signal $\overline{R_{KP}}$ 420 (similar to read keeper signal $\overline{R_{KP}}$ 260 of FIG. 2) is de-asserted low as depicted by arrow 460.

As discussed above, it is important to ensure that data stored in the output latch prior to entering the retention mode is the same data output from the output latch after emerging from the retention mode. As depicted, output signal Q 450 from the output latch, e.g., output signal Q 285 of output latch 225 of FIG. 2, is in a low state prior to entry of the on-chip SRAM into retention mode by retention mode enable signal RET_EN 405. As retention mode enable signal RET_EN 405 is de-asserted when the on-chip SRAM comes out of retention mode, output signal Q 450 remains in the state it was in prior to entry of the retention mode, i.e., low. This is because latch signal LAT 435 is low as well. As disclosed above, when the latch signal, e.g., latch signal LAT 435 is low, its inverse, e.g., latch signal $\overline{LAT}$ 270 of FIG. 2 is high. As the inverse of the latch data, e.g., the inverse of latch data $\overline{LAT}$ 450, is applied to a NOR gate in the output latch, e.g., NOR gate 275 of output latch 225 of FIG. 2, the output of the NOR gate of the output latch, e.g., NOR gate 275 of output latch 225 of FIG. 2, will always be low, irrespective of any other input to the NOR gate of the output latch.

Figure 5:
FIG. 5 illustrates a block diagram of an example of an on-chip memory system on an IC constructed according to the principles of the disclosure.
Figure 5:
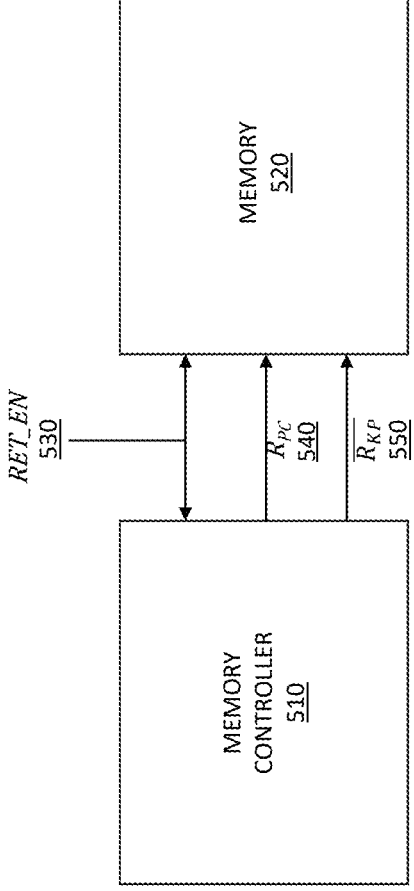

FIG. 5 illustrates a block diagram of an example of on-chip memory system 500 on an IC constructed according to the principles of the disclosure. Memory system 500 includes memory controller 510 and memory 520. Memory 520 is similar to on-chip SRAM 200 disclosed above and includes all associated circuitry for on-chip SRAM 200, e.g., memory cells 205, 210, 215, read bit line $\overline{R_{BL}}$ 220, and output latch 225. In some embodiments, memory controller

510 is not external to on-chip memory 520 but, instead, located on on-chip memory 520 of the IC. In some embodiments, this IC includes other circuitry, e.g., central processing units (CPUs), graphics processing units (GPUs), other processing units, other memory, input/output circuitry, power management circuitry, communications protocol circuitry, etc. In some embodiments, memory controller 510 is part of this other circuitry of the IC.

As disclosed above, when an on-chip SRAM enters a retention mode, a retention mode enable signal, e.g., retention mode enable signals RET_EN 280 of FIG. 2, RET_EN 305 of FIG. 3, and RET_EN 405 of FIG. 4, is applied to the on-chip SRAM. As depicted in FIG. 5, retention mode enable signal 530, similar to retention mode enable signals RET_EN 280 of FIG. 2, RET_EN 305 of FIG. 3, and RET_EN 405 of FIG. 4, is applied to both memory controller 510 and memory array 520.

Also as disclosed above, a read pre-charge signal and a read keeper signal is also applied to the on-chip SRAM. Read pre-charge signal $R_{PC}$ 540, similar to read pre-charge signal $R_{PC}$ 240 of FIG. 2, read pre-charge signal $R_{PC}$ 310 of FIG. 3, and read pre-charge signal $R_{PC}$ 410 of FIG. 4, is applied to memory array 520 from memory controller 510. Read keeper signal $\overline{R_{KP}}$ 550, similar to read keeper signal $\overline{R_{KP}}$ 260 of FIG. 2, read keeper signal $\overline{R_{KP}}$ 320 of FIG. 3, and read keeper signal $\overline{R_{KP}}$ 420 of FIG. 4, is applied to memory array 520 from memory controller 510.

Figure 6:
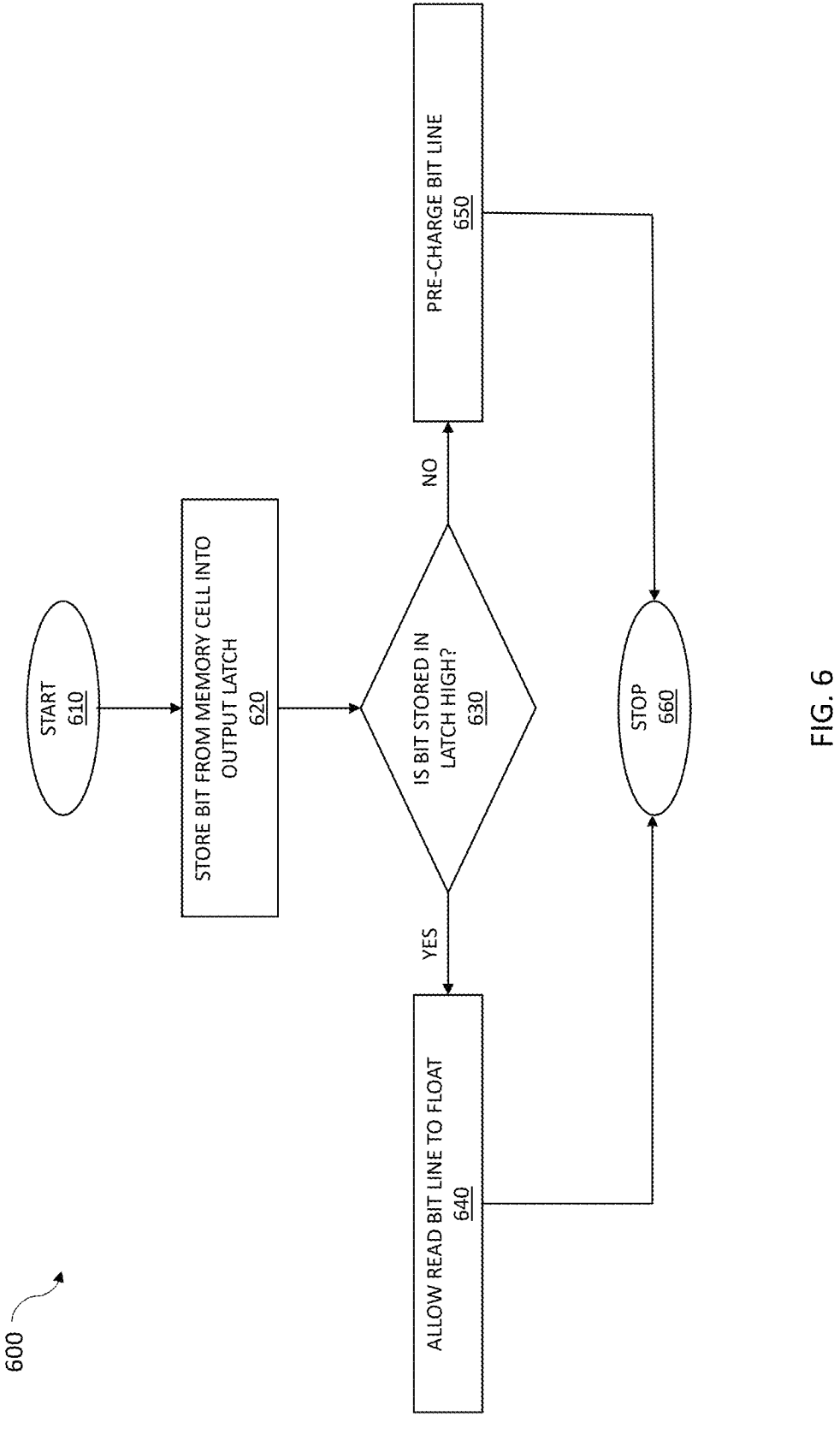
FIG. 6 illustrates a flow diagram of an example of a method of pre-charging a read bit line carried out according to the principles of the disclosure.

FIG. 6 illustrates a flow diagram 600 of an example of a method of pre-charging a read bit line carried out according to the principles of the disclosure. This method starts at step 610. At step 620, a bit from a memory cell is stored into an output latch (e.g., from memory cell 205, 210, 215 into d_lat 230 of output latch 225 of FIG. 2). At step 630, it is determined if the bit stored in the output latch is high. If so, at step 640 a read bit line (e.g., read bit line $\overline{R_{BL}}$ 220 of FIG. 2) is allowed to float. If it is determined that the bit stored in the output latch is low in step 630, the read bit line (e.g., read bit line $\overline{R_{BL}}$ 220 of FIG. 2) is pre-charged. The method ends at step 660.

In some embodiments, a library of circuit designs comprise the above-described on-chip SRAM where the on-chip SRAM includes the above-described array of memory cells arranged in columns and rows with a read bit line ($R_{BL}$) and read bit line complement ($\overline{R_{BL}}$) for each column of the array of memory cells where each memory cell in the column is connected to the read bit line and read bit line complement for that column. Further, the array of memory cells includes a word line (WL) for each row of the array of memory cells where each memory cell in the row is connected to the WL of that row. In some embodiments, the on-chip SRAM of the library of circuit designs includes an output latch to store a bit for one of the array of memory cells in a data latch of the output latch when the on-chip SRAM is in a retention mode. In some embodiments, the on-chip SRAM of the library of circuit designs includes a first transistor of the output latch, where when the data latch is in a high state, the first transistor prevents pre-charging of the RBL for the column corresponding to the one of the array of memory cells.

In some embodiments, a library of circuit designs comprise the above-disclosed on-chip SRAM where the on-chip SRAM includes the above-disclosed array of memory cells arranged in columns and rows, read bit lines $R_{BL}$ and $\overline{R_{BL}}$ for each column of the array of memory cells, word line WL for each row of the array of memory cells, and output latch to store a bit for one of the memory cells of the array of memory cells in a data latch of the output latch when the on-chip SRAM is in a retention mode. In some embodiments, each memory cell in the column of memory cells is connected the read bit lines $R_{BL}$ and $\overline{R_{BL}}$ for that column. In some embodiments, each memory cell in a row of memory cells is connected to word line WL of that row. In some embodiments, when the data latch is in a high state, a first transistor of the output latch prevents pre-charging of read bit line $R_{BL}$ for a column corresponding to one memory cell of array of memory cells.

Figure 7:
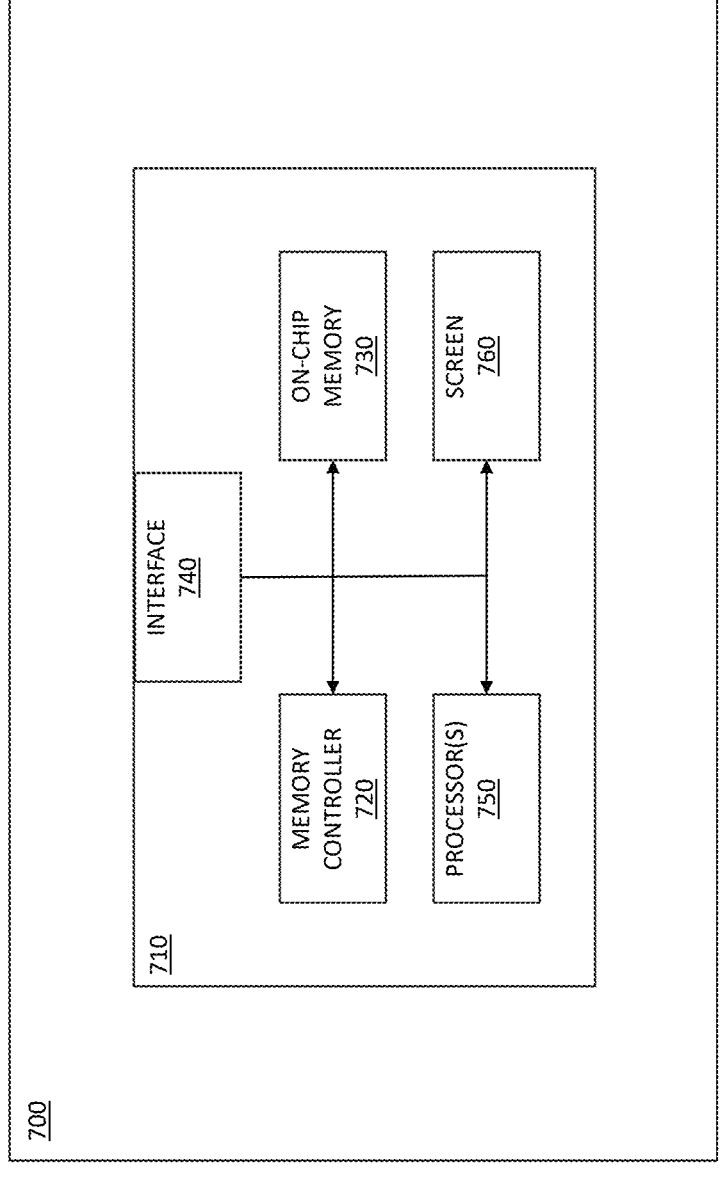
FIG. 7 illustrates a block diagram on an example of a battery power mobile communication device constructed according to principles of the disclosure.

FIG. 7 illustrates a block diagram of a battery powered mobile communication device 700 constructed according to the principles of the disclosure. As discussed above, management of the power consumed by an IC is important so that performance levels of the IC can continue to increase, especially in a battery powered mobile communication device. Battery power mobile communication device 700 comprises at least IC 710. Similar to on-chip memory system 500 of FIG. 5, IC 710 includes at least a memory controller 720 and on-chip memory 730. On-chip memory 730 can be similar to on-chip SRAM 200 of FIG. 2. IC 710 further includes an interface 740, one or more processors 750, and screen 760. In some embodiments, memory controller 720 of IC 710 is included in one or more processors 750 as discussed above. On chip memory 720 includes the above-disclosed array of memory cells arranged in columns and rows, read bit lines RBL and $\overline{R_{BL}}$ for each column of the array of memory cells, word line WL for each row of the array of memory cells, and output latch to store a bit for one of the memory cells of the array of memory cells in a data latch of the output latch when the on-chip SRAM is in a retention mode. In some embodiments, each memory cell in the column of memory cells is connected the read bit lines RBL and $\overline{R_{BL}}$ for that column. In some embodiments, each memory cell in a row of memory cells is connected to word line WL of that row. In some embodiments, when the data latch is in a high state, a first transistor of the output latch prevents pre-charging of read bit line $R_{BL}$ for a column corresponding to one memory cell of array of memory cells.

A portion of the above-described apparatus, systems or methods may be embodied in or performed by various digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, or functions, systems or apparatuses described herein. The data storage media can be part of or associated with the digital data processors or computers.

The digital data processors or computers can be comprised of one or more GPUs, one or more CPUs, one or more of other processor types, or a combination thereof. The digital data processors and computers can be located proximate each other, proximate a user, in a cloud environment, a data center, or located in a combination thereof. For example, some components can be located proximate the user and some components can be located in a cloud environment or data center.

The GPUs can be embodied on a single semiconductor substrate, included in a system with one or more other devices such as additional GPUs, a memory, and a CPU. The GPUs may be included on a graphics card that includes one or more memory devices and is configured to interface with a motherboard of a computer. The GPUs may be integrated GPUs (iGPUs) that are co-located with a CPU on a single chip. Configured or configured to means, for example, designed, constructed, or programmed, with the necessary logic and/or features for performing a task or tasks.

Portions of disclosed examples or embodiments may relate to computer storage products with a non-transitory computer-readable medium that have program code thereon for performing various computer-implemented operations that embody a part of an apparatus, device or carry out the steps of a method set forth herein. Non-transitory used herein refers to all computer-readable media except for transitory, propagating signals. Examples of non-transitory computer-readable media include, but are not limited to: magnetic media such as hard disks, floppy disks, and magnetic tape; optical media such as CD-ROM disks; magneto-optical media such as floppy disks; and hardware devices that are specially configured to store and execute program code, such as ROM and RAM devices. Configured or configured to means, for example, designed, constructed, or programmed, with the necessary logic and/or features for performing a task or tasks. Examples of program code include both machine code, such as produced by a compiler, and files containing higher level code that may be executed by the computer using an interpreter.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

Those skilled in the art to which this application relates will appreciate that other and further additions, deletions, substitutions and modifications may be made to the described embodiments. It is also to be understood that the terminology used herein is for the purpose of describing particular embodiments only, and is not intended to be limiting, since the scope of the present disclosure will be limited only by the claims. Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, a limited number of the exemplary methods and materials are described herein.

What is claimed is:

1. An on-chip static RAM (SRAM), comprising:
an array of memory cells arranged in columns and rows;
a read bit line (RBL) and read bit line complement ($\overline{RBL}$) for each column of the array of memory cells, wherein each memory cell in the column is connected to the RBL and RBL for that column;
a word line (WL) for each row of the array of memory cells, wherein each memory cell in the row is connected to the WL of that row;
an output latch to store a bit for one of the array of memory cells in a data latch of the output latch when the on-chip SRAM is in a retention mode, the output latch external to the one of the array of memory cells; and
a first transistor of the output latch, wherein when the data latch is in a high state, the first transistor prevents pre-charging of the $\overline{RBL}$ for the column corresponding to the one of the array of memory cells when in the retention mode.

2. The on-chip static RAM (SRAM) as recited in claim 1, wherein the output latch further comprises a second and third transistor controlled by a memory controller.

3. The on-chip static RAM (SRAM) as recited in claim 2, wherein the second transistor is controlled by a read pre-charge signal ($R_{PC}$) received from the memory controller.

4. The on-chip static RAM (SRAM) as recited in claim 2, wherein the third transistor is controlled by a read pre-charge keeper signal ($\overline{R_{PK}}$) received from the memory controller.

5. The on-chip static RAM (SRAM) as recited in claim 1, wherein the output latch receives a retention enable signal (RET_EN) from a memory controller that indicates when the on-chip SRAM is entering or emerging from the retention mode.

6. The on-chip static RAM (SRAM) as recited in claim 5, wherein the output latch includes a NOR gate and generates an output Q when the NOR gate receives the RET_EN and an output from the data latch.

7. A method of pre-charging a read bit line of an on-chip static RAM (SRAM) comprising an array of memory cells arranged in columns and rows, the method comprising:
storing a bit for one of the array of memory cells in a data latch of an output latch external to the one of the array of memory cells when the on-chip SRAM enters a retention mode; and
when the data latch is in a high state, allowing the read bit line to float rather than pre-charge when in the retention mode.

8. The method of pre-charging a read bit line as recited in claim 7, wherein the read bit line is a read bit line complement ($\overline{RBL}$).

9. The method of pre-charging a read bit line as recited in claim 7, wherein a first transistor of the output latch allows the read bit line to float.

10. The method of pre-charging a read bit line as recited in claim 7, further comprising controlling a second transistor of the output latch by a read pre-charge signal ($R_{PC}$) from a memory controller.

11. The method of pre-charging a read bit line as recited in claim 7, further comprising controlling a third transistor by a read pre-charge keeper signal ($\overline{R_{PK}}$) from a memory controller.

12. The method of pre-charging a read bit line as recited in claim 7, further comprising indicating when the on-chip SRAM is entering or emerging from the retention mode based on a retention enable signal (RET_EN) received by the output latch from a memory controller.

13. The method of pre-charging a read bit line as recited in claim 12, further comprising generating an output Q from the output latch when the RET_EN signal and an output from the data latch is applied to a NOR gate of the output latch.

14. An integrated circuit (IC), comprising:
a memory controller to generate a retention enable signal (RET_EN); and
an on-chip static RAM (SRAM) including:
an array of memory cells arranged in columns and rows; and
an output latch to store a bit for one of the array of memory cells in a data latch of the output latch when the on-chip SRAM is in a retention mode,, the output latch external to the one of the array of memory cells, wherein the retention mode is based on the RET_EN signal and a first transistor of the output latch prevents pre-charging a read bit line complement ($\overline{RBL}$) for a column of the array of memory cells corresponding to the one of the array of memory cells when in the retention mode and the data latch is in a high state.

15. The IC as recited in claim 14, wherein the output latch further comprises a second and third transistor controlled by a memory controller.

16. The IC as recited in claim 15, wherein the second transistor is controlled by a read pre-charge signal ($R_{PC}$) received from the memory controller.

17. The IC as recited in claim 15, wherein the third transistor is controlled by a read pre-charge keeper signal ($\overline{R_{PK}}$) received from the memory controller.

18. The IC as recited in claim 14, wherein the output latch receives a retention enable signal (RET_EN) from a memory controller that indicates when the on-chip SRAM is entering or emerging from the retention mode.

19. The IC as recited in claim 18, wherein the output latch includes a NOR gate and generates an output Q when the NOR gate receives the RET_EN signal and an output from the data latch.

20. A library of circuit designs, comprising:
a design for an on-chip static RAM (SRAM), wherein the SRAM includes:
   an array of memory cells arranged in columns and rows;
   a read bit line (RBL) and read bit line complement ($\overline{RBL}$) for each column of the array of memory cells wherein each memory cell in the column is connected to the RBL and $\overline{RBL}$ for that column;
   a word line (WL) for each row of the array of memory cells wherein each memory cell in the row is connected to the WL of that row;
   an output latch to store a bit for one of the array of memory cells in a data latch of the output latch when the on-chip SRAM is in a retention mode, the output latch external to the one of the array of memory cells; and
   a first transistor of the output latch, wherein when the data latch is in a high state, the first transistor prevents pre-charging of the $\overline{RBL}$ for the column corresponding to the one of the array of memory cells when in the retention mode.

21. A battery powered mobile communication device comprising an integrated circuit (IC), the IC comprising:
   at least one processor;
   a memory controller; and
   an on-chip memory including:
   an array of memory cells arranged in columns and rows;
      a read bit line (RBL) and read bit line complement ($\overline{RBL}$) for each column of the array of memory cells wherein each memory cell in the column is connected to the RBL and $\overline{RBL}$ for that column;
      a word line (WL) for each row of the array of memory cells wherein each memory cell in the row is connected to the WL of that row;
      an output latch to store a bit for one of the array of memory cells in a data latch of the output latch when the on-chip memory is in a retention mode, the output latch external to the one of the array of memory cells, wherein the stored bit is used by the at least one processor; and
      a first transistor of the output latch controlled by the memory controller, wherein when the data latch is in a high state, the first transistor prevents pre-charging of the $\overline{RBL}$ for the column corresponding to the one of the array of memory cells when in the retention mode.

22. The battery powered mobile communication device as recited in claim 21, wherein the on-chip memory comprises an on-chip static RAM (SRAM).

23. An on-chip memory, comprising:
   an array of memory cells arranged in columns and rows;
   a read bit line for each column of the array of memory cells wherein each memory cell in the column is connected to the read bit line for that column; and
   an output latch to store a bit for one of the array of memory cells, external to the one of the array of memory cells, when the on-chip memory is in a retention mode, wherein the output latch includes a transistor that does not allow the read bit line for the column corresponding to the one of the array of memory cells to pre-charge when in retention mode and when a data latch in the output latch is in a high state.

24. The on-chip memory as recited in claim 23, wherein the on-chip memory comprises an on-chip static RAM (SRAM).

* * * * *